US005534108A

United States Patent [19]
Qian et al.

[11] Patent Number: 5,534,108
[45] Date of Patent: Jul. 9, 1996

[54] METHOD AND APPARATUS FOR ALTERING MAGNETIC COIL CURRENT TO PRODUCE ETCH UNIFORMITY IN A MAGNETIC FIELD-ENHANCED PLASMA REACTOR

[75] Inventors: Xue-Yu Qian, Milpitas; Gerald Yin, Cupertino; Graham W. Hills, Los Gatos; Robert Steger, Cupertino, all of Calif.

[73] Assignee: Applied Materials, Inc., Santa Clara, Calif.

[21] Appl. No.: 400,468

[22] Filed: Mar. 7, 1995

Related U.S. Application Data

[63] Continuation of Ser. No. 69,049, May 28, 1993, abandoned.
[51] Int. Cl.[6] .................................................. H05H 1/00
[52] U.S. Cl. ........................................ 156/643.1; 156/345
[58] Field of Search ................................ 156/345, 643.1; 204/298.37; 315/111.41, 111.21; 118/723 MA, 723 MR

[56] References Cited

U.S. PATENT DOCUMENTS

| | | | |
|---|---|---|---|
| 4,740,268 | 4/1988 | Bukhman | 156/643 |
| 4,829,215 | 5/1989 | Kim et al. | *315/111.41 |
| 4,919,783 | 4/1990 | Asamaki et al. | 204/298.37 |
| 5,087,857 | 2/1992 | Ahn | 315/111.21 |

FOREIGN PATENT DOCUMENTS

| | | |
|---|---|---|
| 84028 | 4/1988 | Japan . |
| 243286 | 10/1988 | Japan . |
| 130533 | 5/1989 | Japan . |
| 51228 | 2/1990 | Japan . |

Primary Examiner—Thi Dang
Attorney, Agent, or Firm—Peter J. Sgarbossa; Raymond R. Moser, Jr.

[57] ABSTRACT

A magnetic field enhanced plasma etch reactor system and method of operation is disclosed. In the system and operation, modulated sinusoidal currents are generated and applied 90° out of phase to opposing pairs of series connected electromagnets to produce a modified rotating magnetic field parallel to a substrate processed in the system. The modification of the rotating magnetic field, in turn, results in an improvement in the uniformity of the etch pattern over the upper surface of the substrate.

28 Claims, 8 Drawing Sheets

$SIN\left[\frac{\pi}{4}(1+t^{\frac{1}{n}})\right]\ n=1$ $COS\left[\frac{\pi}{4}(1+t^{\frac{1}{n}})\right]\ n=1$

METHOD AND APPARATUS FOR ALTERING MAGNETIC COIL CURRENT TO PRODUCE ETCH UNIFORMITY IN A MAGNETIC FIELD-ENHANCED PLASMA REACTOR

This application is a continuation of patent application Ser. No. 08/069,049 entitled Method and Apparatus for Altering Magnetic Coil Current to Produce Etch Uniformity in a Magnetic Field-Enhanced Plasma Reactor filed on May 28, 1993, now abandoned.

BACKGROUND OF INVENTION

The present invention relates to a magnetic field-enhanced plasma etch reactor and to associated processes for etching substrate materials.

Magnetic field-enhanced etch reactors for plasma etching of a substrate are well known. In such reactors, a magnetic field perpendicular to an electric field in a cathode plasma sheath can enhance plasma density. In this regard, the dense plasma is usually located at an east side of the magnetic field lines due to what is commonly referred to as the ExB drift providing a higher etch rate in that area. In an attempt to produce uniform etching, such reactors commonly employ a rotating magnetic field to average out plasma density differences. Such a rotating magnetic field is generated using two pairs of electromagnets on opposite sides of the reactor chamber containing the substrate to be etched. The magnetic field produced by current flowing in one pair of coils is perpendicular to the other. When the pairs of coils are driven by sinusoidal currents which are 90 degrees out of phase, a rotating magnetic field is created parallel to the upper surface of the substrate in the reactor chamber.

Even with plasma reactors employing such a rotating magnetic field, nonuniform plasma densities and etch rates persist and substrates processed in such reactors still exhibit undesirable non-uniform etch patterns. In particular, on the substrates processed by such magnetic field-enhanced plasma reactors, such non-uniformities and differences commonly occur in particular regions such as the four corner regions of the upper surface of the substrate between adjacent electromagnets. In addition, electrical components on such substrates are subject to charge up damage due to non-uniform plasma density. Further, such nonuniform plasma densities often result in (i) differences in "selectivity" of etch rate on the substrates, (ii) differences in residue deposit distribution on the substrate and (iii) differences in corrosion or erosion on the substrate. Such non-uniformities and differences also may be found on the surfaces of the hardware comprising such reactors including the reactor chamber surfaces, gas distribution plate, cathode pedestal components and so on.

A unique reactor system having the capability of instantaneously and selectively altering the magnetic field strength and direction is described in commonly assigned U. S. Pat. No. 4,842,683 issued Jun. 27, 1989 and entitled "Magnetic Field-Enhanced Plasma Etch Reactor". The patent is incorporated herein by this reference both for completeness of the description of the background of this invention and also for completeness of the detailed description hereinafter set forth. The unique magnetic field-enhanced reactor described in the patent improves the uniformity of the resulting etch patterns on substrates processed by the reactor.

Despite the improvements represented by the above-referenced patent, non-uniform plasma density and etch rates persist and the resulting etch patterns still regularly exhibit non-uniformities of about 6% or more where non-uniformity is defined as the maximum etch rate minus the minimum etch rate divided by twice the mean etch rate over the entire area of the etched surface of the substrate. Therefore, there is continuing need to provide a magnetic field enhanced plasma etch reactor and associated processes which will regularly produce more uniform plasma densities and etch rates and etch patterns with non-uniformities of less than 6%. The present invention satisfies such requirements.

SUMMARY OF THE INVENTION

The present invention achieves the foregoing objectives by addressing the root cause of the foregoing non-uniformities, that is the non-uniformity of plasma enhancement provided by the rotating magnetic field. In this regard, the present invention provides a method for selectively controlling the degree of plasma enhancement by a rotating magnetic field in magnetic field-enhanced plasma reactors. In particular, in such reactors employing the method of the present invention, etch rate uniformities have been reduced to about plus or minus 3%. Generally, the method of the present invention comprises etching a test substrate in a magnetic field-enhanced plasma etcher employing a rotating magnetic field parallel to the substrate and generated by 90 degree out of phase sinusoidal currents applied to opposing electromagnets in the reactor. The test substrate is inspected and irregularities in the etch pattern and their locations on the substrate are noted, particularly those in the four corner regions of the substrate. Then with a different substrate in the reactor, modulated sinusoidal currents are selectively generated and applied to the electromagnets of the reactor to produce a modified rotating magnetic field that is characterized by either a variable amplitude and a uniform rotating field period, or, a variable speed of rotation within a cycle of fixed amplitude and fixed period. By controlled modulation of the sinusoidal electromagnet currents, the variable amplitude magnetic field is tailored to enhance or reduce the magnetic field at the areas exhibiting irregularities in etch pattern noted in the inspection of the test substrate, e.g. the four corner regions. Alternatively, the constant amplitude magnetic field of variable speed of rotation is tailored to speed up or slow down over the noted areas of etch pattern irregularities, e.g. to speed up over the four corner regions of the substrate and to slow down over regions between the four corners. In either case, the result is a substantial improvement in plasma density uniformity and/or etch uniformity over the surface of the substrate. Further, the previously mentioned problems and other undesired process performances such as charge up damage, lattice damage, nonuniform profile, nonuniform selectivity, nonuniform residue deposit and nonuniform corrosion and erosion of the substrate and reactor hardware may be controlled.

Preferably, in the foregoing method, the amplitudes of the electromagnet currents producing the rotating magnetic field are stepped in time to follow the instantaneous value of a sinusoidal current (F or S) plus or minus a magnitude controlled version of a harmonic of the fundamental frequency of the sinusoidal current (e.g. F+ or −FF or, S+ or −SS). The harmonic is selected such that the resulting amplitude modulated currents when applied to the electromagnets of the reactor will generate an amplitude modulated rotating magnetic field which in turn produces a more uniform etch rate and an etch pattern on a substrate having a much improved uniformity. For example, to improve the etch uniformity of the substrate, the rotating magnetic field may be modulated such that the enhancement of plasma density by the magnetic field in the four corner regions is somewhat reduced. This has been found to significantly improve the uniformity of the etch rate in the four corner regions and the overall etch uniformity of the substrate.

Alternatively, according to the method of the present invention, the amplitudes of the electromagnet currents may be stepped in time to follow a square wave like pattern having a phase angle modulated waveform represented by $F\sim\text{Sin}\,[\pi/4\,(1+t^{1/n})]$ or $S\sim\text{Cos}[\pi/4(1+t^{1/n})]$, where F and S represent modulated sinusoidal electromagnet currents and the waveforms thereof approach a square wave like waveform with increasing values of n. When currents having such stepped amplitudes are applied to the electromagnets of the plasma reactor, the resulting rotating magnetic field is characterized by a uniform amplitude and variable velocity within a single cycle of rotation. Specifically, in response to amplitude stepped currents following the above expressions particularly where n is 4 or greater, the resulting rotating magnetic field is characterized by a uniform amplitude and increased rotational velocity over each of the four corner regions of the substrate. This has been found to produce improvements in the uniformity of plasma density and etch pattern substantially equivalent to those associated with the foregoing method utilizing amplitude stepped currents following sinusoidal signals plus or minus a harmonic thereof.

An example of a magnetic field enhanced plasma etched reactor system for practicing the forgoing processes includes front and side series connected pairs of electromagnets disposed on opposite sides of and around the periphery of a vacuum chamber containing a substrate to produce a rotating magnetic field substantially parallel to and over the substrate. In addition, the reactor includes current generating means for generating electromagnet currents that are 90 degrees out of phase and for amplitude stepping the electromagnet currents in time to follow either (i) the instantaneous value of a sinusoidal current (F or S) plus or minus a harmonic of the fundamental frequency of the sinusoidal current (F+or –FF or, S +or –SS) or (ii) a square wave like pattern having a waveform represented by $F\sim\text{Sin}\,[\pi/4\,(1+t^{1/n})]$ or $S\sim\text{Cos}[\pi/4(1+t^{1/n})]$, where the waveforms approach a square wave like waveform with increasing values of n.

Preferably, the current generating means comprises a computer and an electromagnet coil driver. The computer stores in memory tables of listings of different series of time stepped values of first and second command currents which are output to the coil driver to produce corresponding electromagnet currents. When applied to the electromagnets, such electromagnet currents produce a rotating magnetic field having a modified field pattern, particularly over certain regions of a substrate mounted in the reactor, e.g. over the four corner regions of the substrate. Thus the operator controlled output of the computer controls the coil driver to generate the selected time stepped electromagnet currents which in turn result in the desired modified rotating magnetic field and an improved plasma density distribution and substrate etch pattern particularly in the four corner regions of the substrate.

Preferably, the listings of amplitude time stepped command currents stored in the computer comprise listings of current values following either (i) the instantaneous value of a sinusoidal current (F or S) plus or minus a harmonic of the fundamental frequency ( e.g. F+ or –FF or S+ or –SS) or (ii) the instantaneous value of a square wave like pattern having a phase angle modulated waveform represented by $F\sim\text{Sin}\,[\pi/4(1+t^{1/n})]$ or $S\sim\text{Cos}[\pi/4(1+t^{1/n})]$. In the first case, the harmonic preferably is the second harmonic of the fundamental frequency of the sinusoidal current. In creating the listings of the stepped command currents, different magnitude versions of the second harmonic are selectively added to and or subtracted from successive quarter-cycles of the sinusoidal currents. In the second case, the listings may follow the instantaneous value of the square wave like waveform.

In either case, the computer stores in memory a plurality of tables of electrical current data each listing different series of steps in the magnitude of the command currents corresponding to the electromagnet currents to be generated by the electromagnet coil driver. In particular, user controllable means in the computer allow for selection of a listing of stepped currents which when applied as commands to the coil driver will produce selected amplitude time stepped electromagnet currents resulting in (i) the desired modified rotating magnetic field, (ii) uniform etching of the substrate processed by the reactor and (iii) a substantial reduction in the previously listed non-uniform plasma density distribution related problems.

DETAILED DESCRIPTION OF INVENTION

Figure 1:
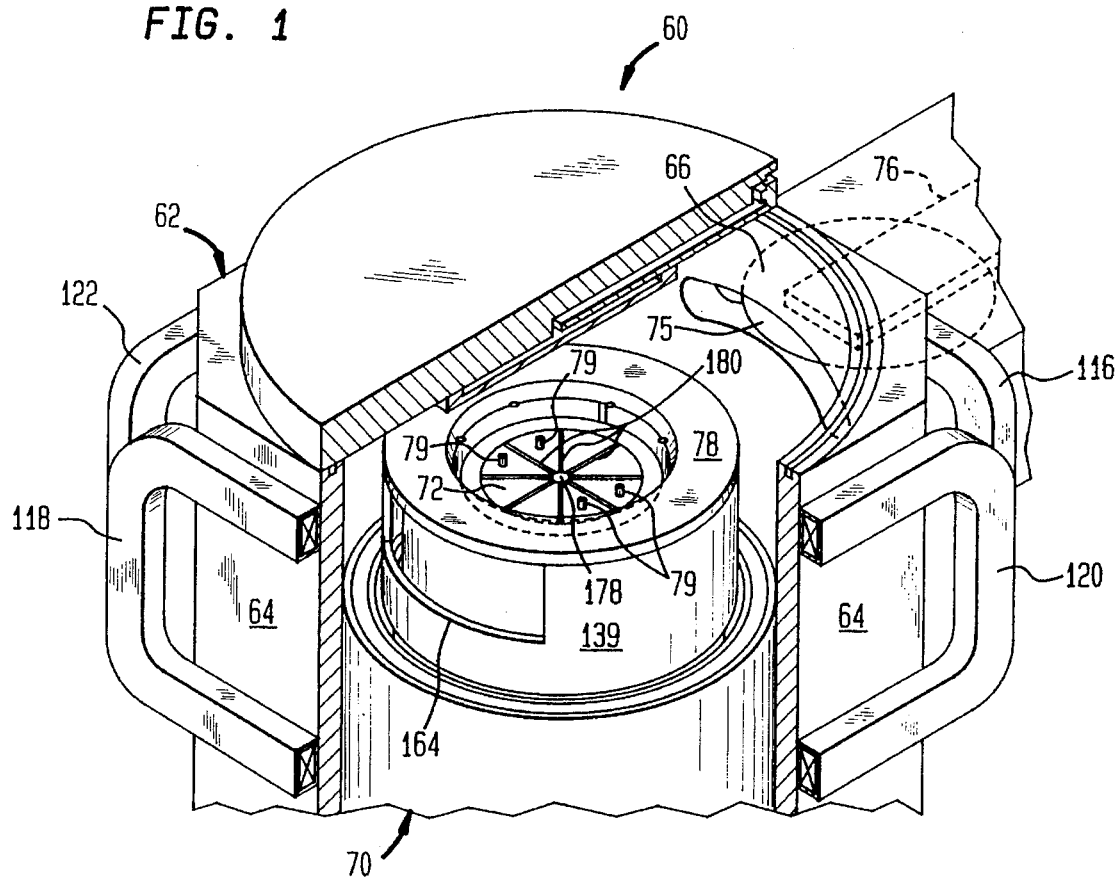
FIG. 1 is an isometric view partially cut away, of the structure of a magnetic field-enhanced plasma reactor incorporating the present invention, and corresponds to FIG. 6 of U.S. Pat. No. 4,842,683.

The above-referenced U.S. Pat. No. 4,842,683 incorporated by reference herein describes a reactor system 60 shown in FIGS. 1, 2 and 3 hereof. The reactor is distinct from prior art rotating magnetic field plasma reactors which typically rotate a resultant magnetic field at a fixed relatively high frequency. Rather, in the patented reactor, the magnitude and/or direction of the resultant magnetic field can be changed instantaneously and stepped about the wafer processed by the reactor. To accomplish this the reactor system 60 comprises a housing 62 having octagon-shaped outer walls 64 and a circular inner wall 66 defining an etch chamber 68. The system 60 also includes a gas and liquid cooled pedestal/cathode assembly 70 and a wafer exchange system 74.

Process gases are supplied to the interior of the chamber 68 by a gas manifold 80 from a gas supply system 81. The gas supply system 81 communicates with the manifold 80 and chamber 68 via supply lines 82.

Vacuum is supplied to the chamber and spent gases are exhausted via annular exhaust chamber 90 communicating with exhaust port 92 connected to a vacuum pumping system 93. The exhaust flow is directed from the chamber 68 through holes 94 in a horizontal annular plate 96 mounted about the upper periphery of the cathode assembly 70. The plate 96 inhibits plasma penetration into the annular exhaust chamber 90.

Figure 2:
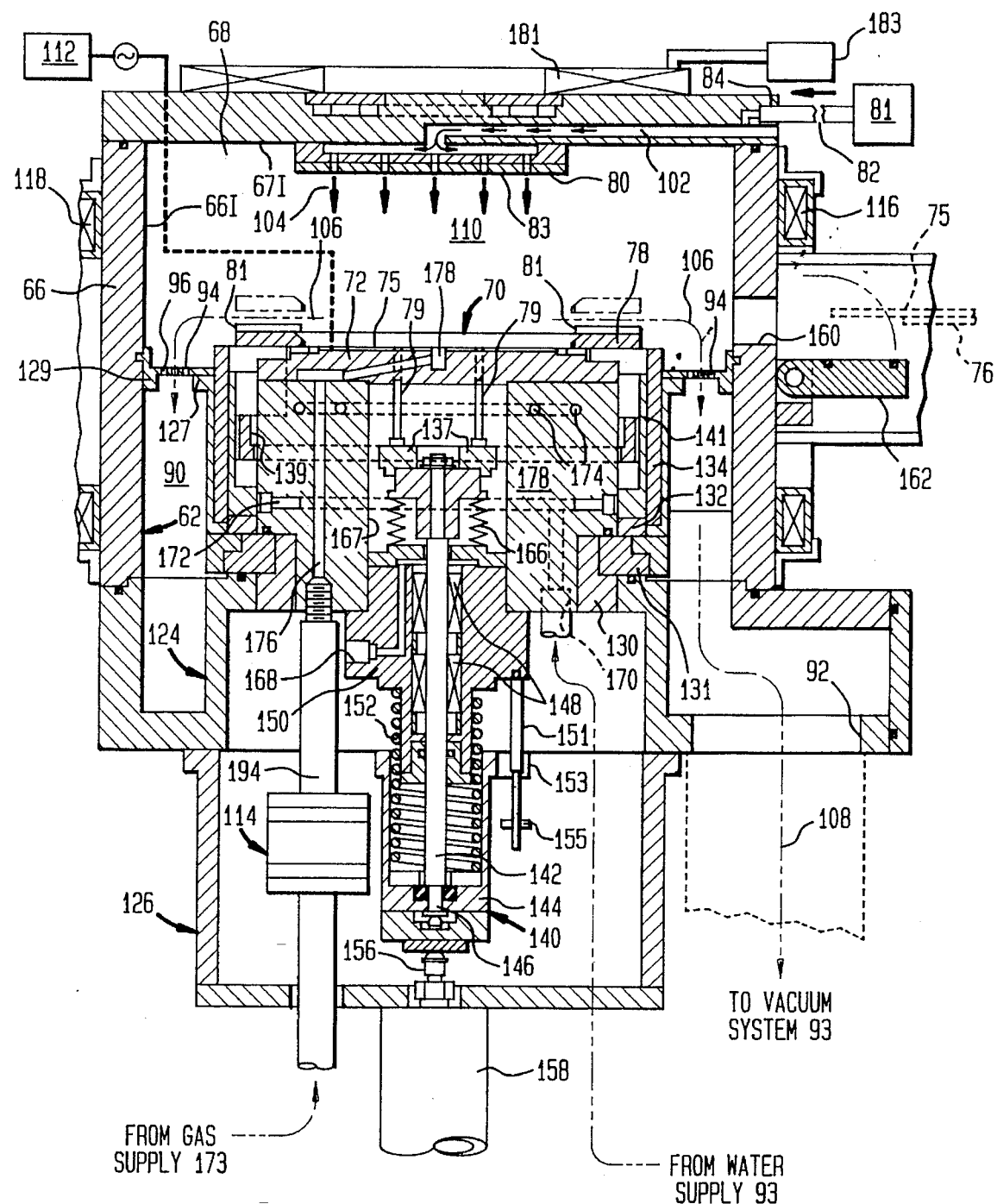
FIG. 2 is a vertical cross section partially in schematic, of the reactor shown in FIG. 1 and corresponds to FIG. 7 of the above-referenced patent.

As indicated in FIG. 2, gas communicated to inlet 84 is routed into manifold 80 and downwardly to form an etching gas plasma in chamber processing region 110 during application of RF power. The RF power is supplied by an RF supply system 112 to the reactor system 60 for plasma operation.

Referring to FIG. 1, the reactor system includes a number of paired electromagnets 116, 118, 120 and 122, typically comprising copper coils, mounted in a rectangular array, one each on alternating outer walls of the octagon-shaped housing. The two coil pairs cooperatively provide a quasi-static, multidirectional field which can be stepped or rotated about the wafer to provide etch uniformity at high and low pressures. Also, the magnitude of the field can be varied to select etch rate and decrease ion bombardment.

Figure 3:
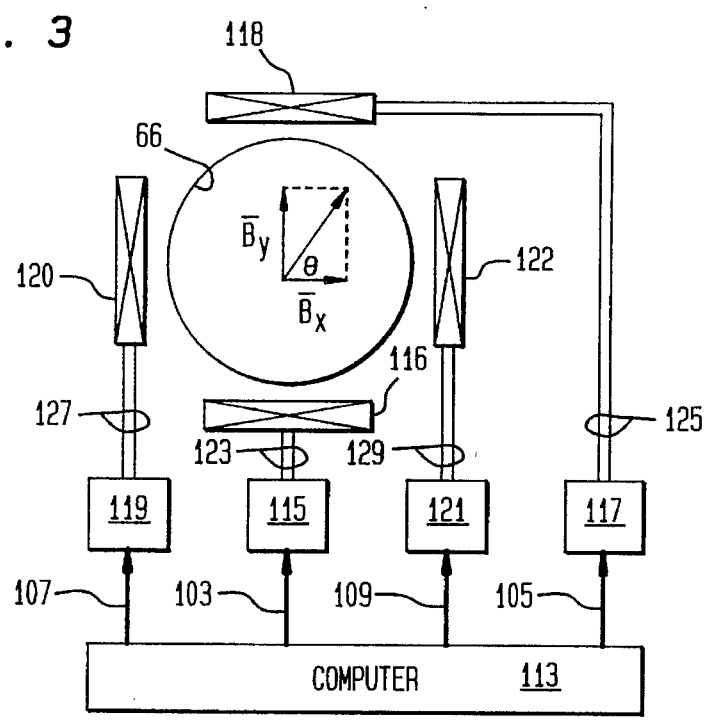
FIG. 3 is a schematic representation of the system for generating and computer controlling multi-directional DC magnetic fields in the reactor of FIG. 1 and corresponds to an upper portion of FIG. 12 of the above-referenced patent.

As depicted in FIG. 3, a computer 113 is utilized to control the current in the individual electromagnets via lines 103, 105, 107 and 109 to power supply systems 115, 117, 119 and 121. Such individual current control independently regulates the magnitude and direction of the currents supplied to the electromagnets, the magnitude and angular orientation of the separate magnetic fields generated by each electromagnet and a resultant magnetic field vector. Both the magnitude and the direction of the magnetic field provided by the paired electromagnetic configuration may be changed instantaneously according to the teachings of the above-referenced patent. Thus, the resultant magnetic field can be stepped about the substrate at any desired rate from a few cycles per second to provide uniform etching.

As previously noted however, in practice, the etch pattern across the processed wafer or substrate is not as uniform as desired, commonly exhibiting a non-uniformity of more than six percent (6%) with etch pattern non-uniformities particularly appearing in the four corner regions of the wafer. The present invention on the other hand, substantially improves the uniformity of the etch rate particularly in the four corner regions of the upper surface of the processed substrate such that the resulting etch pattern is subject to non-uniformities of about three percent (3%) or less. Such uniformity has not hitherto been achievable with prior magnetic field enhanced plasma reactors.

Figure 4:
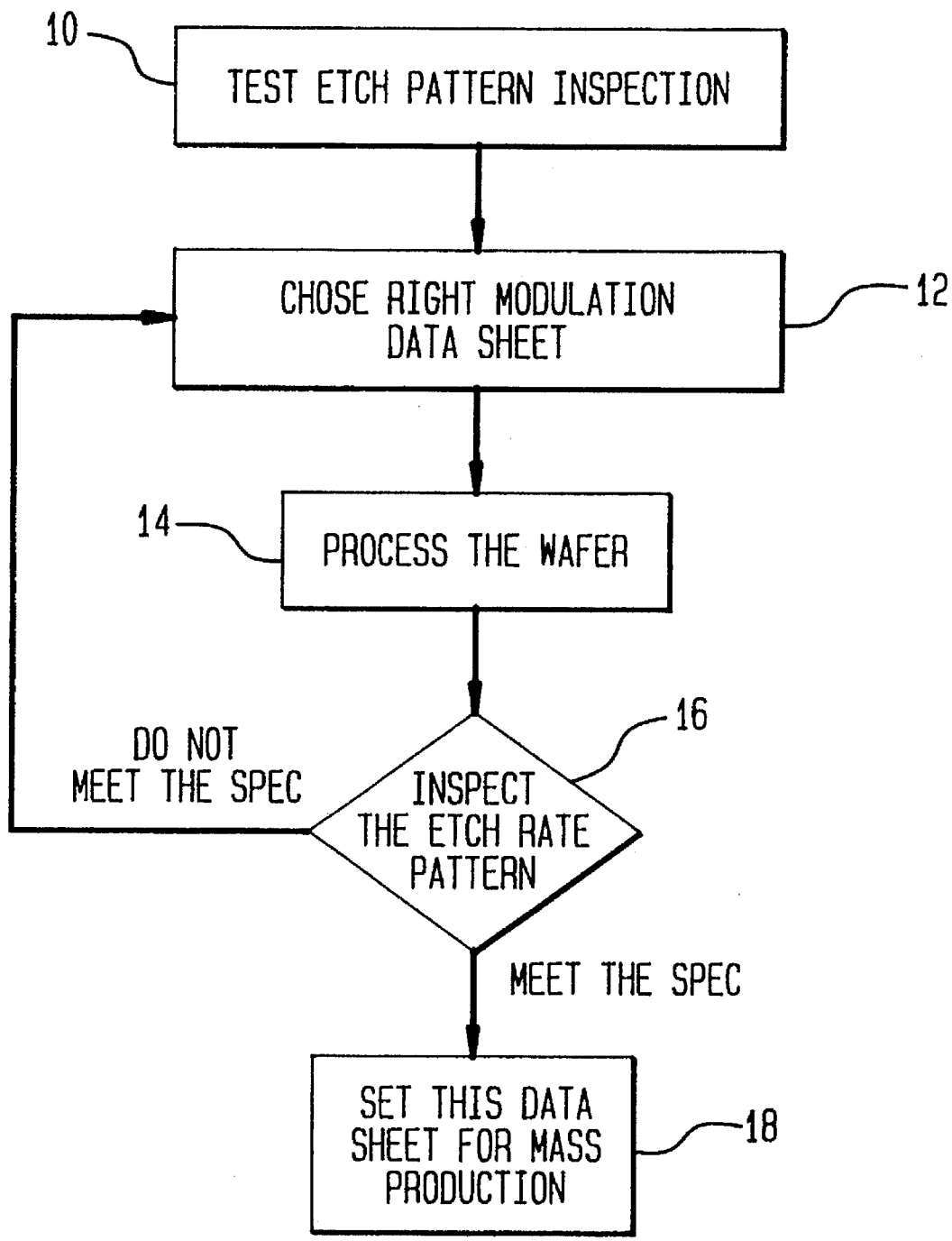
FIG. 4 is a block flow diagram depicting the steps included in the process of the present invention.
Figure 5:
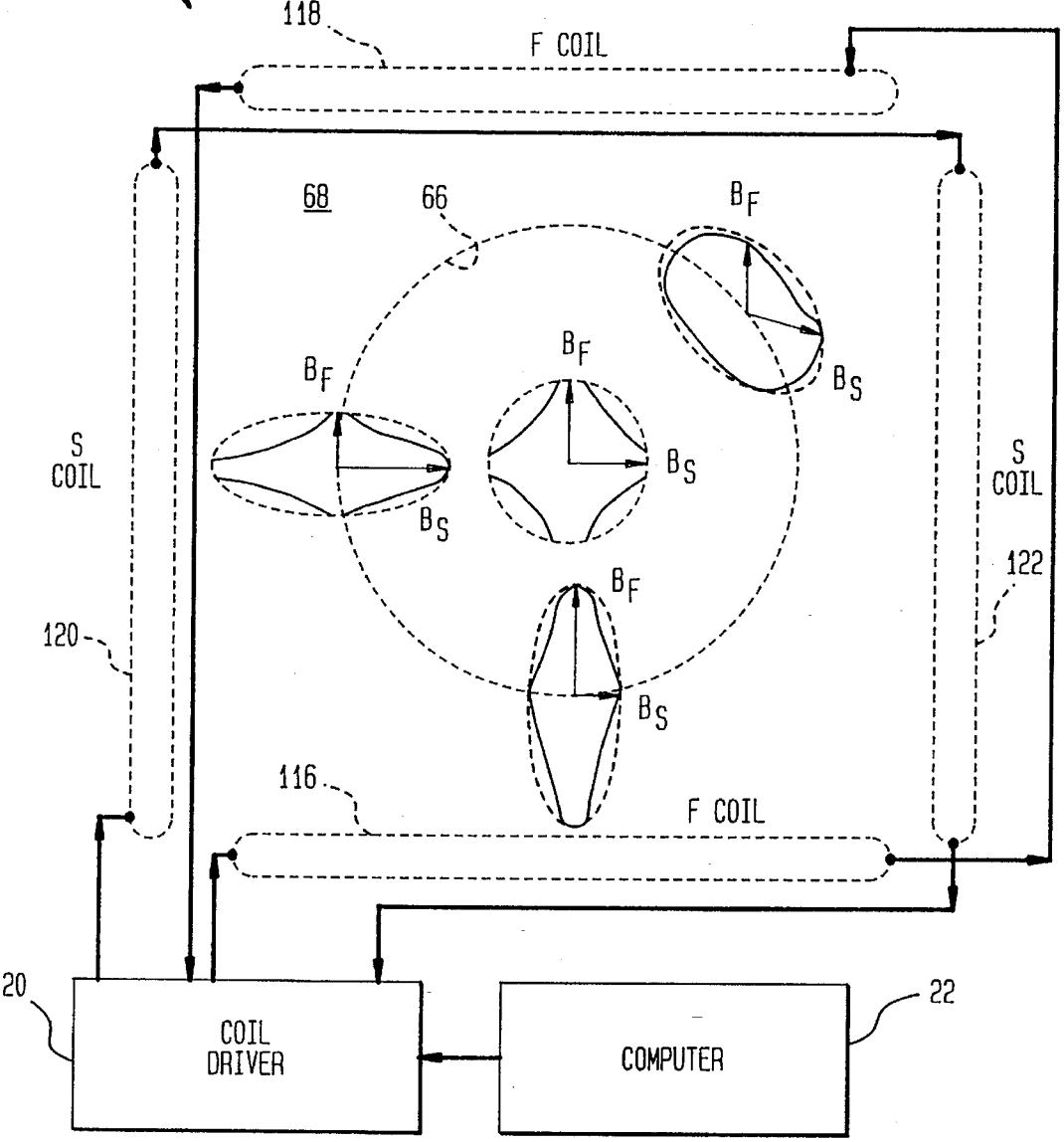
FIG. 5 is a schematic representation of the system of present invention for computer controlled generation of a modified rotational magnetic field in a magnetic field enhanced plasma reactor according to the present invention.

The basic process for producing such uniform etching of a processed substrate is depicted in FIG. 4 and may be accomplished utilizing the reactor of FIGS. 1 and 2 in the system of FIG. 5. As represented, the process of the present invention basically comprises a step 10 of inspecting the etch pattern of a test substrate processed by a magnetically enhanced plasma etch reactor such as illustrated in FIGS. 1 and 2. An inspector checks for non-uniformities in the etch pattern across the upper surface of the substrate and notes the areas of non-uniformity. In the past, the principal areas of non-uniformities have been in regions defining four corners of the substrate.

To accomplish step 10 an operator may, prior to etching with the reactor, measure the film thickness on the test substrate at a number of test points, e.g. 100 points. Then after etching with the reactor for a given period of time, e.g. 1 minute, the operator measures film thickness at the test points and determines the differences point by point. The difference at any given point is the amount of film etched away at the point. The operator may next calculate a standard deviation for the differences in etch, the maximum and minimum etch rates for the test points and the mean etch rate. Preferably, the operator automatically performs step 10 using apparatus such as a SpectraMap 200 manufactured by Prometrix of Santa Clara, Calif. A monitor connected to the SpectraMap 200 displays the contour of the upper surface of the substrate. Using a keyboard of the SpectraMap 200, the operator can select either a planar or a 3-D display of contour lines for the substrate with an indication of etch rate for each contour line. This enables the operator to visually note the particular areas of etch pattern irregularity where etch rate compensation is required to improve etch uniformity. For example, by viewing the display, the operator may note that in the four corner regions the etch rate is higher than over the balance of the substrate and to improve etch uniformity the etch rate should be reduced in such regions. Alternatively, the operator may note that in another region the etch rate is less than over the balance of the substrate and to improve etch uniformity the etch rate should be increased in such a region.

Following the inspection step 10, a particular modulated sinusoidal current pattern is selected by the operator for each pair of series connected electromagnets 116–122 included in the reactor 60. The selected modulated electromagnet currents are those which the operator believes will produce a modified rotating magnetic field which, in turn, will produce a controlled enhancement of the plasma density and improved uniformity in etch rate in the regions identified in the inspection step 10, thereby producing a uniform etch pattern over the entire upper surface of the processed substrate. For example, to improve etch uniformity by reducing the etch rate in the four corner regions, the operator will select modulated electromagnet currents which will produce a modified rotating magnetic field reducing plasma density enhancement and etch rate in the four corner regions. This step is depicted as 12 in FIG. 4 and more specifically includes the selection of a correct modulation data table and listing of current magnitude steps corresponding to those desired for the currents applied to the electromagnets. Such tables of steps are stored in the memory of a computer 22 included in the reactor system shown in FIG. 5. The computer 22, for example, may comprise a 68010 processor as utilized in the system described in the previously referenced United States Patent.

As will be more fully described hereafter, an operator using the computer 22 calls up a menu of the stored tables of listings of stepped magnitudes for the electromagnet currents. From the tables he selects the listings of stepped values for the electromagnet current magnitudes which he believes will most closely generate a modified rotating magnetic field resulting in a truly uniform etch pattern on the substrate in the reactor 60.

Following step 12, such modulated sinusoidal currents are applied to the coils in the electromagnets and a substrate or wafer is processed in the reactor of FIGS. 1 and 2. In such processing, the modulated sinusoidal currents produce a modified rotating magnetic field which results in improved uniformity of the etch pattern over the surface of the wafer. This portion of the process is depicted by step 14 in FIG. 4.

Following the processing of the wafer, the etch pattern of the wafer is inspected for non-uniformities in step 16. The inspection of the wafer corresponds closely to the inspection step 10. If the inspection of step 16 reveals that the etch pattern meets specifications for uniformity of etch, then the selected listing is established as the standard for future use in the mass production of wafers using the reactor of FIGS. 1 and 2. This is depicted in step 18 in FIG. 4. If, on the other hand, the inspection in step 16 reveals that the resulting etch pattern does not meet predetermined specifications for etch uniformity, a different listing is selected in step 12 and the process of steps 12, 14 and 16 is repeated until the etch pattern of the processed wafer meets such specifications.

With regard to the foregoing process and method depicted in FIG. 4, and as previously indicated in the "Background of Invention", it is well known that with conventional magnetic field enhanced plasma etch reactors, the sinusoidal currents applied to the pairs of coils in the electromagnets and the resulting rotating magnetic field produce an unbalanced or nonuniform etch pattern. Commonly, upon inspection, such patterns have non-uniformities particularly in the four corners of the wafer surface. As previously described, the U.S. Pat. 4,842,683 addresses the problems of non-uniformity in etch patterns by controlling the currents in individual electromagnets to independently control the magnitude and angular rotation of the resultant magnetic field vector to provide for instantaneous change of the magnetic field both in magnitude and or direction and a stepping of the field around the wafer at a slow rate of a few cycles per minute to provide uniform etching. As stated in the patent, such independent current control is to be distinguished from the more conventional control of direction and magnitude of a rotating magnetic field in prior commercial plasma reactors. In such prior reactors, the rotating magnetic field was produced by applying sinusoidal currents that are 90 degrees out of phase to opposing pairs of electromagnets surrounding the chamber in which a substrate is housed for processing. In the present invention, rather than providing for independent and instantaneous control of each of four currents applied to the electromagnets of the reactor shown in FIGS. 1 and 2 hereof, the present invention generates and applies amplitude stepped currents following particular amplitude modulated sinusoidal waveforms to two pairs of electromagnets to generate a rotating magnetic field which is selectively modified as to amplitude or velocity of rotation over regions where the etch pattern is not uniform. This approach has been found to significantly improve the uniformity of the etch produced by the reactor of FIGS. 1 and 2 and has resulted in etch patterns having non-uniformities of substantially less than 6%, a performance heretofore unattainable with magnetic field enhanced plasma etch reactors.

More particularly, and referring to the system of FIG. 5, the reactor 60 includes the vacuum chamber 68 bounded by the circular inner-wall 66 and housing the pedestal assembly 72 (see FIGS. 1 and 2) for mounting a substrate within the chamber. Also depicted in FIGS. 1 and 2 is the gas manifold 80 and supply system 81 communicating with the chamber 68 for supplying a reactant gas to the chamber. An RF power system is also included for creating an etching gas plasma from the inlet gases in the process region 110.

In addition to the foregoing, and as depicted in FIG.5, the reactor 60 includes at least the first pair of electromagnets 116 and 118 located on opposing sides of the chamber 68 and the second pair of electromagnets 120 and 122 located on opposing sides of the chamber between the electromagnets 116 and 118 as depicted. The electromagnets 116 and 118 include series connected coils indicated as front or "F" coils while the electromagnets 120 and 122 include series connected side or "S" coils as depicted.

Figure 6:
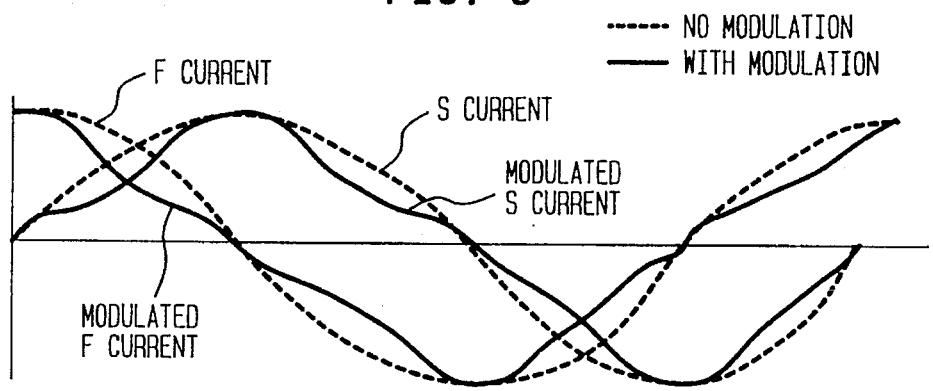
FIG. 6 is a schematic representation in dotted line of sinusoidal currents (F and S currents) applied to electromagnets in a magnetic field enhanced plasma reactor and in solid lines depicts amplitude modulated sinusoidal current signals generated to produce a modified rotating magnetic field resulting in a uniform etch pattern on the upper surface of a substrate processed in accordance with the present invention.

The S coils and the F coils of the electromagnets are driven from a coil driver 20 under control of the computer 22. The coil driver 20 may comprise the magnet driver power amplifier manufactured by Sierracin/Magnedyne of Carlsbad, Calif. The magnet driver is a two channel power switching amplifier designed to control the current in two separate inductive/resistive loads. Each channel is designed to provide up to 25 amps peak to peak in response to analog current commands from the computer 22. As will be described in detail hereafter, the computer-controlled stepping the magnitudes of the analog commands produces a modulated sinusoidal current (S coil current) applied to the series connected S coils of electromagnets 120 and 122 while a modulated sinusoidal current (F coil current) 90 degrees out of phase with the S coil current is generated and applied to the series connected coils of the electromagnets 118 and 120. In FIG. 6, such F and S currents are depicted in dotted lines illustrating the amplitude-stepped sinusoidal-like waveforms of the currents generated by the coil driver 20 and applied to the F and S coils, respectively. As previously discussed, such amplitude-stepped sinusoidal-like currents being 90 degrees out of phase, produce a rotating magnetic field within the chamber 68 and, in combination with the plasma, produce an etching of the upper surface of the wafer housed within the chamber.

To enhance the uniformity of the etch pattern on the wafer, the present invention comprises a method and means for modulating the amplitude-stepped sinusoidal-like currents to modify the rotating magnetic field and produce a uniform etching of the wafer. Waveforms depicting the amplitude modulated waveforms for the F and S currents are also set forth in FIG. 6.

To produce such modulated amplitude-stepped sinusoidal-like currents, and the resulting modified rotating magnetic field, the present invention preferably includes the computer 22 for applying amplitude controlled analog command currents to the coil driver 20 which will in turn produce output currents having amplitude modulated and stepped sinusoidal-like waveforms as depicted generally in FIG. 6. As such modulated currents are applied to the F and S coils respectively, the rotating magnetic field is produced as a composite of the instantaneous magnetic components $B_F$ and $B_s$ in FIG. 5. As previously mentioned, the composite modified rotating magnetic field is of reduced strength over the four corner regions of the substrate and has been found to reduce the etch rate in the four corner regions and to produce a uniform etch pattern over the entire upper surface of the wafer.

Figure 7:
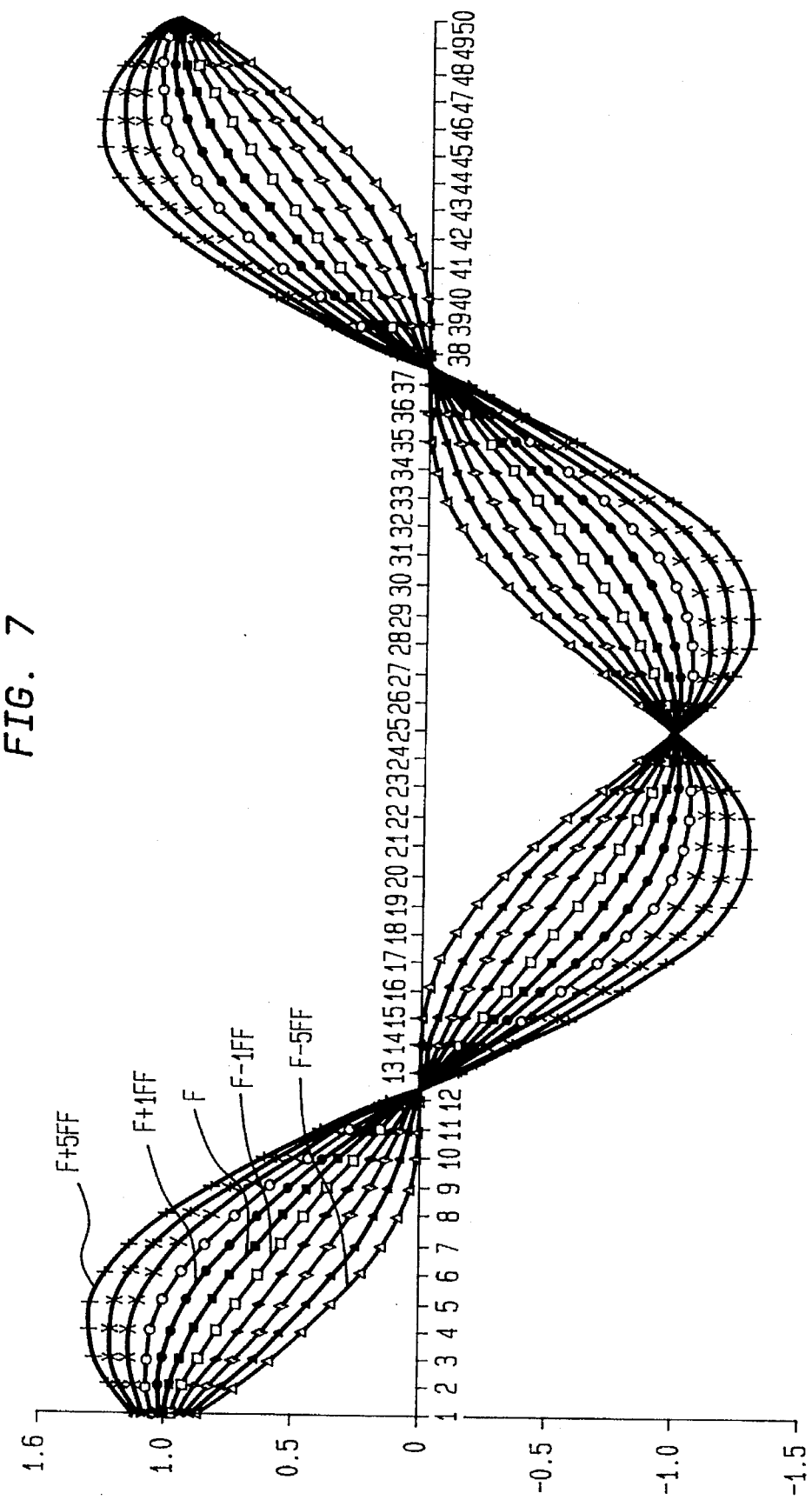
FIG. 7 is a series of curves depicting sinusoidal F currents applied to coils of a first or front pair of electromagnets in a magnetic field enhanced plasma reactor and a plurality of modulated sinusoidal currents comprising a combination of the F current with different magnitudes of a harmonic thereof.
Figure 8:
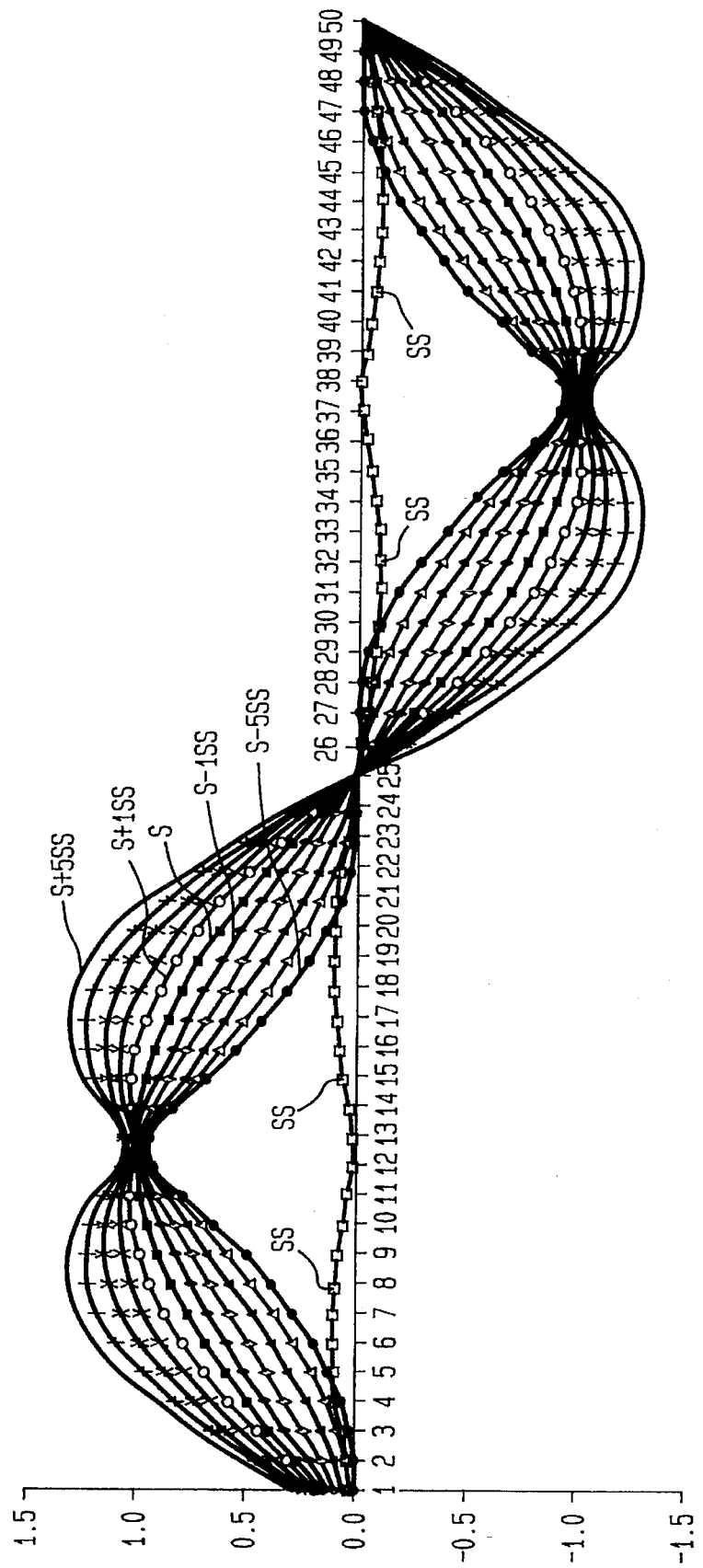
FIG. 8 is series of curves depicting sinusoidal S currents applied to coils of a second or side pair of electromagnets included in the reactor and a plurality of modulated sinusoidal currents comprising combinations of the S current with different magnitudes of a harmonic thereof.

In accordance with the present invention, the modulated F current and modulated S current of FIG. 6 depict the amplitude-stepped sinusoidal-like currents generated in accordance with the present invention and, as shown, follow in waveform a combination of a fundamental and a magnitude controlled harmonic of the sinusoidal F and S currents. Such amplitude modulated F and S currents are generated in the coil driver 20 by corresponding analog commands generated by the computer 22. In this regard, FIGS. 7 and 8 depict a series of modulated amplitude-stepped sinusoidal-like F coil currents and a series of modulated amplitude-stepped sinusoidal-like S coil currents that may be generated by the coil driver 20 in response to appropriately stepped analog command currents from the computer 22.

In accordance with one method of the present invention, the stepped analog command currents for producing the amplitude modulated F and S coil currents depicted in FIGS. 7 and 8 may follow certain columns of current data listed in the following Tables 1–4 setting forth particular time stepped combinations of the sinusoidal F and S coil currents and a magnitude controlled harmonic of the fundamental frequency thereof. In particular, the Tables 1–4 set forth various step changes in the magnitudes of various combinations of the sinusoidal F and S currents with different magnitude versions of a second harmonic thereof. The command current data comprising such combinations may be stored in the memory of the computer 22 and are available for independent selection by the computer operator for output as stepped command currents to the coil driver 20.

Referring specifically to the Table 1, the first two columns present the relative magnitudes of the S and F currents respectively over the period of one cycle of the sinusoidal currents. The third column presents computed phase angle for the sinusoidal currents while the fourth column sets forth instantaneous values of one tenth (0.10) of the second harmonic of the fundamental frequency of the S coil current inverted in value during the second and third quadrants of the cycle of the S current. The fifth through eighth columns depict instantaneous values of the stepped magnitudes of combinations of column one and column four, that is, the S current minus magnitude controlled versions of one times, two times, three times and four times the second harmonic, respectively. Table 2 continues with columns depicting the instantaneous values of combinations of column one and column four, that is, the S current minus five times and plus one time through five times magnitude controlled versions of the second harmonic, respectively. As represented by the headings of the columns in Tables 3 and 4, such Tables provide similar columns of stepped command currents comprising combinations of instantaneous values of the sinusoidal F current as set forth in column two of Table 1 and magnitude controlled versions of the second harmonic of fundamental frequency of the F current as set forth in column two of Table 3.

Within the computer 22, tables of information corresponding to the listings of stepped command currents, as set forth in the columns headed S–SS through S+5SS and F–FF through F+5FF in Tables 1–4, may be stored in the memory of the computer. Following inspection of a processed test wafer, as in the previously described step 10 of FIG. 4, an operator using the computer 22 calls up menus of the various tables of listings of command currents corresponding to the series of timed steps in the magnitude of the F and S currents for generation by the coil driver 20. From such tables he selects a listing of an appropriate series of stepped command currents for output from the computer to the coil driver 20. For example, if the operator noted an excessive etch rate in the four corner regions of the test substrate and selects listings as represented by the columns of Tables 1–4 headed S–5SS and F–5FF, commands currents followings the currents data in such columns are output from the computer 22 to the coil driver 20. The coil driver, in turn generates amplitude stepped sinusoidal-like F and S currents similar in waveform to the waveforms F–5FF and S–5SS in FIGS. 7 and 8. Such modulated F and S currents follow the waveforms depicted in FIG. 6 and upon application to the electromagnets of the reactor 60 produce a modified rotating magnetic field. The modified magnetic field generated by such modulated F and S currents is characterized by an amplitude modulation which has been found to substantially reduce the etch rate in the four corner regions and thereby materially improve the uniformity of the etch of the substrate. For other regions where the etch rate is below the mean etch rate, listings represented by the columns headed S+SS and F+FF or a multiple of SS and FF may be selected to result in an increase in the etch rate at such regions and a similar improvement in etch uniformity.

As previously stated, the uniformity of the etch pattern may be similarly improved by the method of the present invention comprising the generation and application of currents following square wave like waveforms to the electromagnets of the reactor 60. The following Table 5 and FIGS. 9A, 9B, 9C, 10 and 11 specifically relate to this method of the present invention.

Figure 9A:
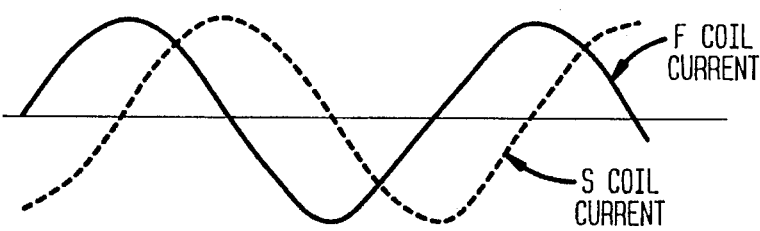
FIGS. 9A, 9B and 9C depict the currents applied to the electromagnets of the plasma reactor modulated towards square waves as the value of n in the equations for the current waveforms is increased from 1 towards 32.
Figure 9B:
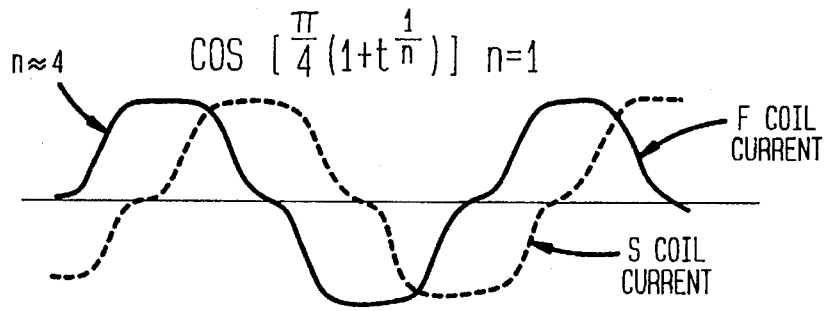
Figure 9C:
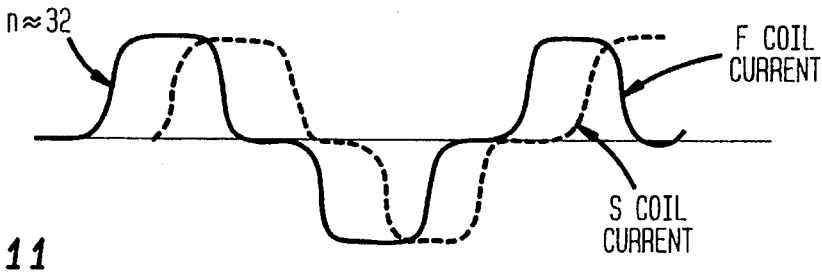
Figure 11:
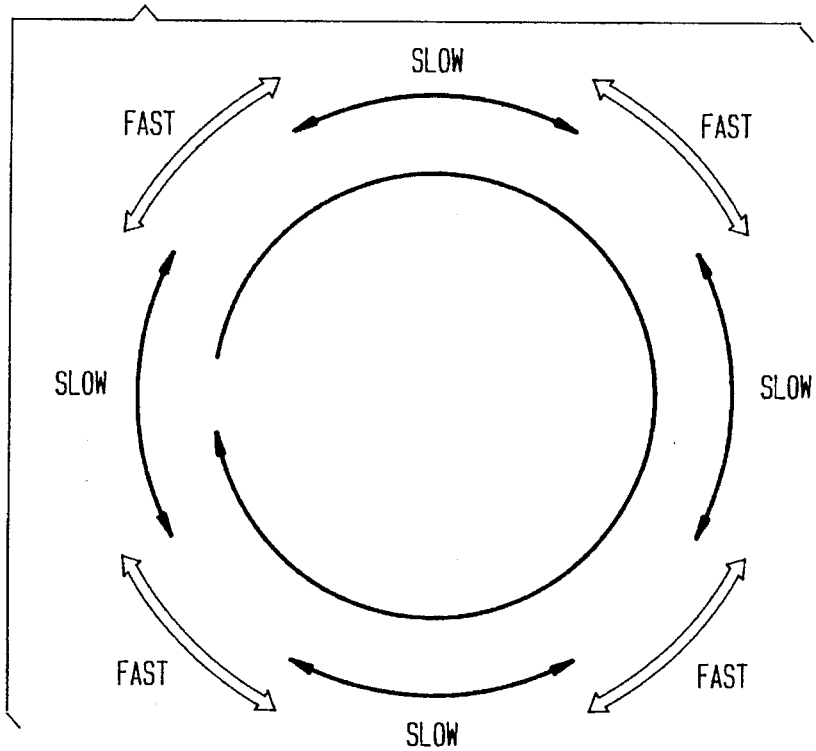
FIG. 11 depicts the change in rotational velocity of the uniform amplitude magnetic field produced by the currents depicted in FIGS. 9B and 9C over a single cycle.
Figure 10:
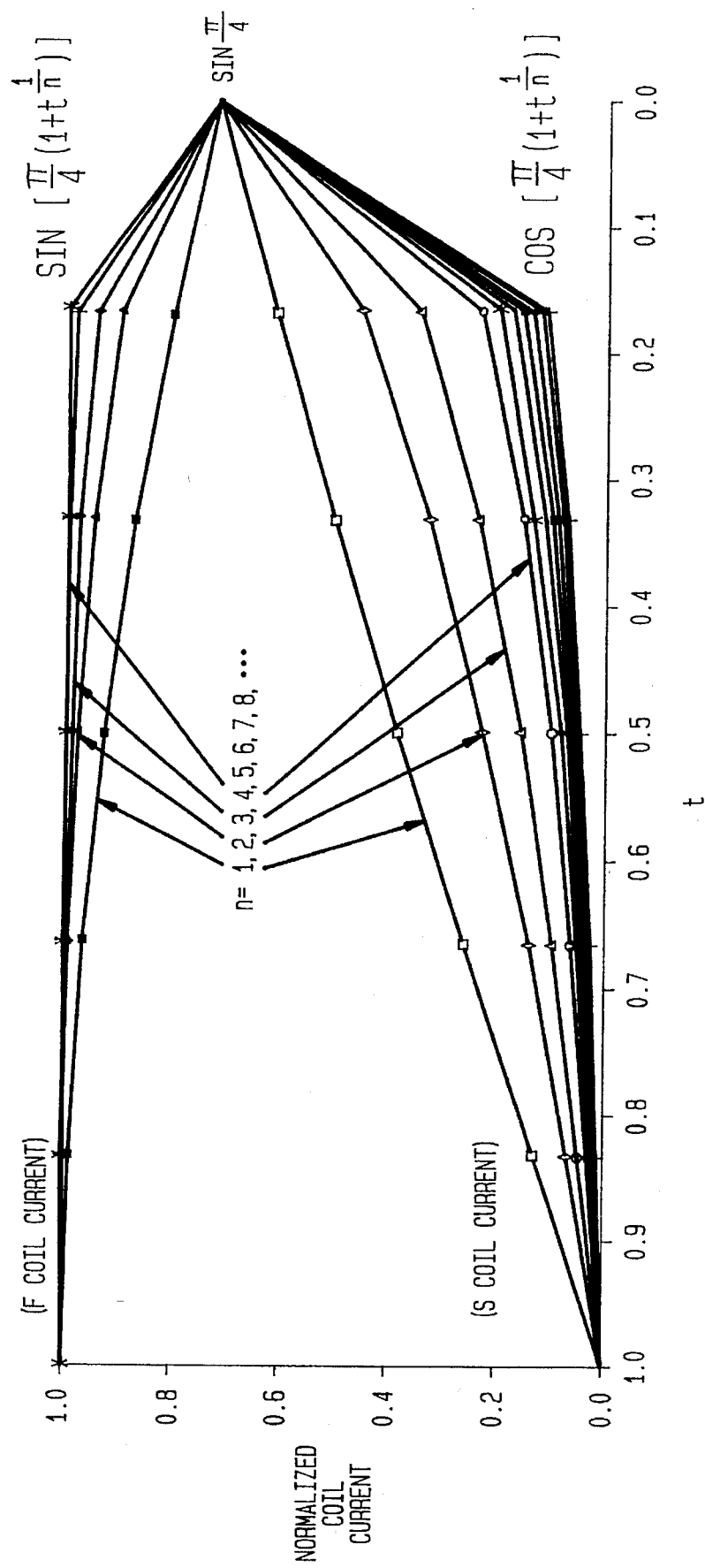
FIG. 10 depicts a quadrant or 45 degrees of the electromagnet currents of FIG. 9A at 6 different time steps for different values of n and illustrates the progression of the waveform of the currents toward a square wave as n increases in value.

As depicted in Table 5, listings of data for generating amplitude-stepped square wave like waveform command currents following the expressions of FIGS. 9A and 10 may be generated and stored in the memory of the computer 22 with or separate from the listings depicted in Tables 1–4. Table 5 depicts the normalized value of such command currents for the 6 points of time depicted in FIG. 10 during each quarter cycle of a sinusoidal current for n=1 through 12 in the sinusoidal waveform expressions F~Sin $[\pi/4(1+t^{1/n}]$ and S~Cos$[\pi/4(1+t^{1/n})]$, with phase angle modulation. FIG. 9A depicts the current waveform for the expressions when n=1, FIG. 9B depicts the current waveform for the expressions when n=4 and FIG. 9C depicts the current waveform for the expressions when n=32. As represented, as the value of n increases the waveform resembles more a square-like waveform. Further, when currents following such waveform are applied as F and S currents to the electromagnets of the reactor, a rotating magnetic field of uniform amplitude and variable velocity is produced. As the value of n increases to 4 and above, the velocity of the magnetic field over the four corner regions increases as depicted in FIG. 11. In practice it has been found that such velocity modulation during a single cycle of the magnetic field produces a substantial improvement in the uniformity of the etch pattern over the substrate due to a reduction of the etch rate in the four corner regions.

Thus, following the method of the present invention as depicted in FIG. 4 and using the system of FIG. 5, an operator selects from the memory of the computer 22 one of the listings of command currents as depicted in Table 5. The command currents are output by the computer 22 to the coil driver 20 to produce amplitude-stepped square wave like F and S currents. Such currents are applied to the F and S coils and generate a modified magnetic field. If the operator has selected correctly, the resulting magnetic will be characterized by a velocity of rotation modulation which will affect the desired improvement in uniformity of etch.

Thus, with the method and apparatus described in the foregoing specification, an operator is able to affect a selective modulation of the rotating magnetic field and an enhancement of the uniformity of etch and plasma density not heretofore possible with known magnetic field enhanced plasma reactors.

While a particular reactor, system and particular processes have been described in some detail herein, the present invention is not limited to such specifics. For example, while the invention is particularly useful in improving etch rate uniformity in the four corner regions of the substrate, the principles of the invention may be applied to enhancement of etch rate uniformity and improved plasma density distribution at other regions of the substrate and within the reaction chamber by proper selection of command current data and generation of modulated F and S currents appropriate to such enhancements. Further, while the method of the present invention has been described as including operator notation of etch rate non-uniformities and etch pattern irregularities at particular regions of a substrate followed by operator selection of particular modulated electromagnet currents, such notation and control may be automated or simplified. For example, a 10% non-uniformity in etch rate in the four corner regions may automatically produce selection of particular modulated electromagnet currents corresponding to S −2SS and F−2FF, whereas a 25% non-uniformity in etch rate may produce an automatic selection of electromagnet currents corresponding to S−3SS and F−3FF, etc. Still further, while the process of the present invention is preferably practiced by effectively amplitude modulating the sinusoidal electromagnet currents with a second harmonic, other harmonics such as the fourth harmonic may likewise be utilized. Accordingly, the present invention is to be limited in scope only by the terms of the followings claims.

TABLE 1

| S | F | U = ASIN(S) | SS = 0.1 sin(2U) | S − 1SS | S − 2SS | S − 3SS | S − 4SS |
|---|---|---|---|---|---|---|---|
| 0.125 | 0.992 | 0.125327831 | 0.024803919 | 0.100196 | 0.075392 | 0.050588 | 0.025784 |
| 0.248 | 0.968 | 0.250615213 | 0.048050498 | 0.19995 | 0.151899 | 0.103849 | 0.055798 |
| 0.368 | 0.929 | 0.376857162 | 0.068435178 | 0.299565 | 0.23113 | 0.162694 | 0.094259 |
| 0.481 | 0.876 | 0.50179497 | 0.084340521 | 0.396659 | 0.312319 | 0.227978 | 0.143638 |
| 0.587 | 0.809 | 0.627348247 | 0.095045506 | 0.491954 | 0.396909 | 0.301863 | 0.206818 |
| 0.684 | 0.728 | 0.753231981 | 0.099793139 | 0.584207 | 0.484414 | 0.384621 | 0.284827 |
| 0.77 | 0.637 | 0.878841152 | 0.098258758 | 0.671741 | 0.573482 | 0.475224 | 0.376965 |
| 0.844 | 0.535 | 1.004697945 | 0.090534728 | 0.753465 | 0.662931 | 0.572396 | 0.481861 |
| 0.904 | 0.425 | 1.129034903 | 0.077297868 | 0.826702 | 0.749404 | 0.672106 | 0.594809 |
| 0.951 | 0.309 | 1.256454222 | 0.058808105 | 0.892192 | 0.833384 | 0.774576 | 0.715768 |
| 0.982 | 0.187 | 1.380773903 | 0.037096212 | 0.944904 | 0.907808 | 0.870711 | 0.833615 |
| 0.998 | 0.062 | 1.507540228 | 0.012617499 | 0.985383 | 0.972765 | 0.960148 | 0.94753 |
| 0.998 | −0.062 | 1.507540228 | 0.012617499 | 0.985383 | 0.972765 | 0.960148 | 0.94753 |
| 0.982 | −0.187 | 1.380773903 | 0.037096212 | 0.944904 | 0.907808 | 0.870711 | 0.833615 |
| 0.951 | −0.309 | 1.256454222 | 0.058808105 | 0.892192 | 0.833384 | 0.774576 | 0.715768 |
| 0.904 | −0.425 | 1.129034903 | 0.077297868 | 0.826702 | 0.749404 | 0.672106 | 0.594809 |
| 0.844 | −0.535 | 1.004697945 | 0.090534728 | 0.753465 | 0.662931 | 0.572396 | 0.481861 |
| 0.77 | −0.637 | 0.878841152 | 0.098258758 | 0.671741 | 0.573482 | 0.475224 | 0.376965 |
| 0.684 | −0.728 | 0.753231981 | 0.099793139 | 0.584207 | 0.484414 | 0.384621 | 0.284827 |
| 0.587 | −0.809 | 0.627348247 | 0.095045506 | 0.491954 | 0.396909 | 0.301863 | 0.206818 |
| 0.481 | −0.876 | 0.50179497 | 0.084340521 | 0.396659 | 0.312319 | 0.227978 | 0.143638 |
| 0.368 | −0.929 | 0.376857162 | 0.068435178 | 0.299565 | 0.23113 | 0.162694 | 0.094259 |
| 0.248 | −0.968 | 0.250615213 | 0.048050498 | 0.19995 | 0.151899 | 0.103849 | 0.055798 |
| 0.125 | −0.992 | 0.125327831 | 0.024803919 | 0.100196 | 0.075392 | 0.050588 | 0.025784 |
| 0 | −1 | 0 | 0 | 0 | 0 | 0 | 0 |
| −0.125 | −0.992 | −0.125327831 | −0.024803919 | −0.1002 | −0.07539 | −0.05059 | −0.02578 |
| −0.248 | −0.968 | −0.250615213 | −0.048050498 | −0.19995 | −0.1519 | −0.10385 | −0.0558 |
| −0.368 | −0.929 | −0.376857162 | −0.068435178 | −0.29956 | −0.23113 | −0.16269 | −0.09426 |
| −0.481 | −0.876 | −0.50179497 | −0.084340521 | −0.39666 | −0.31232 | −0.22798 | −0.14364 |
| −0.587 | −0.809 | −0.627348247 | −0.095045506 | −0.49195 | −0.39691 | −0.30186 | −0.20682 |
| −0.684 | −0.728 | −0.753231981 | −0.099793139 | −0.58421 | −0.48441 | −0.38462 | −0.28483 |
| −0.77 | −0.637 | −0.878841152 | −0.098258758 | −0.67174 | −0.57348 | −0.47522 | −0.37696 |
| −0.844 | −0.535 | −1.004697945 | −0.090534728 | −0.75347 | −0.66293 | −0.5724 | −0.48186 |
| −0.904 | −0.425 | −1.129034903 | −0.077297868 | −0.8267 | −0.7494 | −0.67211 | −0.59481 |
| −0.951 | −0.309 | −1.256454222 | −0.058808105 | −0.89219 | −0.83338 | −0.77458 | −0.71577 |
| −0.982 | −0.187 | −1.380773903 | −0.037096212 | −0.9449 | −0.90781 | −0.87071 | −0.83362 |
| −0.998 | −0.062 | −1.507540228 | −0.012617499 | −0.98538 | −0.97277 | −0.96015 | −0.94753 |
| −0.998 | 0.062 | −1.507540228 | −0.012617499 | −0.98538 | −0.97277 | −0.96015 | −0.94753 |
| −0.982 | 0.187 | −1.380773903 | −0.037096212 | −0.9449 | −0.90781 | −0.87071 | −0.83362 |
| −0.951 | 0.309 | −1.256454222 | −0.058808105 | −0.89219 | −0.83338 | −0.77458 | −0.71577 |
| −0.904 | 0.425 | −1.129034903 | −0.077297868 | −0.8267 | −0.7494 | −0.67211 | −0.59481 |
| −0.844 | 0.535 | −1.004697945 | −0.090534728 | −0.75347 | −0.66293 | −0.5724 | −0.48186 |
| −0.77 | 0.637 | −0.878841152 | −0.098258758 | −0.67174 | −0.57348 | −0.47522 | −0.37696 |
| −0.684 | 0.728 | −0.753231981 | −0.099793139 | −0.58421 | −0.48441 | −0.38462 | −0.28483 |
| −0.587 | 0.809 | −0.627348247 | −0.095045506 | −0.49195 | −0.39691 | −0.30186 | −0.20682 |
| −0.481 | 0.876 | −0.50179497 | −0.084340521 | −0.39666 | −0.31232 | −0.22798 | −0.14364 |
| −0.368 | 0.929 | −0.376857162 | −0.068435178 | −0.29956 | −0.23113 | −0.16269 | −0.09426 |
| −0.248 | 0.968 | −0.250615213 | −0.048050498 | −0.19995 | −0.1519 | −0.10385 | −0.0558 |
| −0.125 | 0.992 | −0.125327831 | −0.024803919 | −0.1002 | −0.07539 | −0.05059 | −0.02578 |
| 0 | 1 | 0 | 0 | 0 | 0 | 0 | 0 |

TABLE 2

| S − 5SS | S + 1SS | S + 2SS | S + 3SS | S + 4SS | S + 5SS |
|---|---|---|---|---|---|
| 0.00098 | 0.149804 | 0.174608 | 0.199412 | 0.224216 | 0.24902 |
| 0.007748 | 0.29605 | 0.344101 | 0.392151 | 0.440202 | 0.488252 |
| 0.025824 | 0.436435 | 0.50487 | 0.573306 | 0.641741 | 0.710176 |
| 0.059297 | 0.565341 | 0.649681 | 0.734022 | 0.818362 | 0.902703 |
| 0.111772 | 0.682046 | 0.777091 | 0.872137 | 0.967182 | 1.062228 |
| 0.185034 | 0.783793 | 0.883586 | 0.983379 | 1.083173 | 1.182966 |
| 0.278706 | 0.868259 | 0.966518 | 1.064776 | 1.163035 | 1.261294 |
| 0.391326 | 0.934535 | 1.025069 | 1.115604 | 1.206139 | 1.296674 |
| 0.517511 | 0.981298 | 1.058596 | 1.135894 | 1.213191 | 1.290489 |
| 0.656959 | 1.009808 | 1.068616 | 1.127424 | 1.186232 | 1.245041 |
| 0.796519 | 1.019096 | 1.056192 | 1.093289 | 1.130385 | 1.167481 |
| 0.934913 | 1.010617 | 1.023235 | 1.035852 | 1.04847 | 1.061087 |
| 0.934913 | 1.010617 | 1.023235 | 1.035852 | 1.04847 | 1.061087 |
| 0.796519 | 1.019096 | 1.056192 | 1.093289 | 1.130385 | 1.167481 |
| 0.656959 | 1.009808 | 1.068616 | 1.127424 | 1.186232 | 1.245041 |
| 0.517511 | 0.981298 | 1.058596 | 1.135894 | 1.213191 | 1.290489 |
| 0.391326 | 0.934535 | 1.025069 | 1.115604 | 1.206139 | 1.296674 |
| 0.278706 | 0.868259 | 0.966518 | 1.064776 | 1.163035 | 1.261294 |
| 0.185034 | 0.783793 | 0.883586 | 0.983379 | 1.083173 | 1.182966 |
| 0.111772 | 0.682046 | 0.777091 | 0.872137 | 0.967182 | 1.062228 |
| 0.059297 | 0.565341 | 0.649681 | 0.734022 | 0.818362 | 0.902703 |
| 0.025824 | 0.436435 | 0.50487 | 0.573306 | 0.641741 | 0.710176 |
| 0.007748 | 0.29605 | 0.344101 | 0.392151 | 0.440202 | 0.488252 |
| 0.00098 | 0.149804 | 0.174608 | 0.199412 | 0.224216 | 0.24902 |
| 0 | 0 | 0 | 0 | 0 | 0 |
| −0.00098 | −0.1498 | −0.17461 | −0.19941 | −0.22422 | −0.24902 |
| −0.00775 | −0.29605 | −0.3441 | −0.39215 | −0.4402 | −0.48825 |
| −0.02582 | −0.43644 | −0.50487 | −0.57331 | −0.64174 | −0.71018 |
| −0.0593 | −0.56534 | −0.64968 | −0.73402 | −0.81836 | −0.9027 |
| −0.11177 | −0.68205 | −0.77709 | −0.87214 | −0.96718 | −1.06223 |
| −0.18503 | −0.78379 | −0.88359 | −0.98338 | −1.08317 | −1.18297 |
| −0.27871 | −0.86826 | −0.96652 | −1.06478 | −1.16304 | −1.26129 |
| −0.39133 | −0.93453 | −1.02507 | −1.1156 | −1.20614 | −1.29667 |
| −0.51751 | −0.9813 | −1.0586 | −1.13589 | −1.21319 | −1.29049 |
| −0.65696 | −1.00981 | −1.06862 | −1.12742 | −1.18623 | −1.24504 |
| −0.79652 | −1.0191 | −1.05619 | −1.09329 | −1.13038 | −1.16748 |
| −0.93491 | −1.01062 | −1.02323 | −1.03585 | −1.04847 | −1.06109 |
| −0.93491 | −1.01062 | −1.02323 | −1.03585 | −1.04847 | −1.06109 |
| −0.79652 | −1.0191 | −1.05619 | −1.09329 | −1.13038 | −1.16748 |
| −0.65696 | −1.00981 | −1.06862 | −1.12742 | −1.18623 | −1.24504 |
| −0.51751 | −0.9813 | −1.0586 | −1.13589 | −1.21319 | −1.29049 |
| −0.39133 | −0.93453 | −1.02507 | −1.1156 | −1.20614 | −1.29667 |
| −0.27871 | −0.86826 | −0.96652 | −1.06478 | −1.16304 | −1.26129 |
| −0.18503 | −0.78379 | −0.88359 | −0.98338 | −1.08317 | −1.18297 |
| −0.11177 | −0.68205 | −0.77709 | −0.87214 | −0.96718 | −1.06223 |
| −0.0593 | −0.56534 | −0.64968 | −0.73402 | −0.81836 | −0.9027 |
| −0.02582 | −0.43644 | −0.50487 | −0.57331 | −0.64174 | −0.71018 |
| −0.00775 | −0.29605 | −0.3441 | −0.39215 | −0.4402 | −0.48825 |
| −0.00098 | −0.1498 | −0.17461 | −0.19941 | −0.22422 | −0.24902 |
| 0 | 0 | 0 | 0 | 0 | 0 |

TABLE 3

| V = ACOS(F) | FF = 0.1 cos(2V − 1.5708) | F − 1FF | F − 2FF | F − 3FF | F − 4FF | F − 5FF | F + FF |
|---|---|---|---|---|---|---|---|
| 0.12657559 | 0.025045238 | 0.966955 | 0.94191 | 0.916864 | 0.891819 | 0.866774 | 1.017045 |
| 0.25366174 | 0.048583637 | 0.919416 | 0.870833 | 0.822249 | 0.773665 | 0.725082 | 1.016584 |
| 0.37909483 | 0.068760545 | 0.860239 | 0.791479 | 0.722718 | 0.653958 | 0.585197 | 0.997761 |
| 0.50329105 | 0.084500709 | 0.791499 | 0.706999 | 0.622498 | 0.537997 | 0.453496 | 0.960501 |
| 0.62834744 | 0.095107325 | 0.713893 | 0.618785 | 0.523678 | 0.428571 | 0.333463 | 0.904107 |
| 0.75539616 | 0.099820008 | 0.62818 | 0.52836 | 0.42854 | 0.32872 | 0.2289 | 0.82782 |
| 0.88019609 | 0.098208117 | 0.538792 | 0.440584 | 0.342376 | 0.244168 | 0.145959 | 0.735208 |
| 1.00628858 | 0.090399327 | 0.444601 | 0.354201 | 0.263802 | 0.173403 | 0.083003 | 0.625399 |
| 1.13183444 | 0.076941669 | 0.348058 | 0.271117 | 0.194175 | 0.117233 | 0.040292 | 0.501942 |
| 1.25665493 | 0.058775931 | 0.250224 | 0.191448 | 0.132672 | 0.073896 | 0.01512 | 0.367776 |
| 1.38268894 | 0.036740602 | 0.150259 | 0.113519 | 0.076778 | 0.040038 | 0.003297 | 0.223741 |
| 1.50875654 | 0.012376509 | 0.049623 | 0.037247 | 0.024871 | 0.012494 | 0.000117 | 0.074377 |
| 1.63283612 | −0.01237578 | −0.04962 | −0.03725 | −0.02487 | −0.0125 | −0.00012 | −0.07438 |
| 1.75890371 | −0.036739919 | −0.15026 | −0.11352 | −0.07678 | −0.04004 | 0.0033 | −0.22374 |
| 1.88493772 | −0.058775337 | −0.25022 | −0.19145 | −0.13267 | −0.0739 | −0.01512 | −0.36778 |
| 2.00975821 | −0.0769412 | −0.34806 | −0.27112 | −0.19418 | −0.11724 | −0.04029 | −0.50194 |
| 2.13530407 | −0.090399013 | −0.4446 | −0.3542 | −0.2638 | −0.1734 | −0.083 | −0.6254 |
| 2.26139657 | −0.098207979 | −0.53879 | −0.44058 | −0.34238 | −0.24417 | −0.14596 | −0.73521 |
| 2.38619649 | −0.099820052 | −0.62818 | −0.52836 | −0.42854 | −0.32872 | −0.2289 | −0.82782 |
| 2.51324521 | −0.095107552 | −0.71389 | −0.61878 | −0.52368 | −0.42857 | −0.33346 | −0.90411 |

TABLE 3-continued

| V = ACOS(F) | FF = 0.1 cos(2V − 1.5708) | F − 1FF | F − 2FF | F − 3FF | F − 4FF | F − 5FF | F + FF |
| --- | --- | --- | --- | --- | --- | --- | --- |
| 2.63830161 | −0.084501102 | −0.7915 | −0.707 | −0.6225 | −0.538 | −0.45349 | −0.9605 |
| 2.76249782 | −0.068761079 | −0.86024 | −0.79148 | −0.72272 | −0.65396 | −0.58519 | −0.99776 |
| 2.88793092 | −0.048584279 | −0.91942 | −0.87083 | −0.82225 | −0.77366 | −0.72508 | −1.01658 |
| 3.01501707 | −0.025045949 | −0.96695 | −0.94191 | −0.91686 | −0.89182 | −0.86677 | −1.01705 |
| 3.14159265 | −3.67321E−07 | −1 | −1 | −1 | −1 | −1 | −1 |
| 3.01501707 | −0.025045949 | −0.96695 | −0.94191 | −0.91686 | −0.89182 | −0.86677 | −1.01705 |
| 2.88793092 | −0.048584279 | −0.91942 | −0.87083 | −0.82225 | −0.77366 | −0.72508 | −1.01658 |
| 2.76249782 | −0.068761079 | −0.86024 | −0.79148 | −0.72272 | −0.65396 | −0.58519 | −0.99776 |
| 2.63830161 | −0.084501102 | −0.7915 | −0.707 | −0.6225 | −0.538 | −0.45349 | −0.9605 |
| 2.51324521 | −0.095107552 | −0.71389 | −0.61878 | −0.52368 | −0.42857 | −0.33346 | −0.90411 |
| 2.38619649 | −0.099820052 | −0.62818 | −0.52836 | −0.42854 | −0.32872 | −0.2289 | −0.82782 |
| 2.26139657 | −0.098207979 | −0.53879 | −0.44058 | −0.34238 | −0.24417 | −0.14596 | −0.73521 |
| 2.13550407 | −0.090399013 | −0.4446 | −0.3542 | −0.2638 | −0.1734 | −0.083 | −0.6254 |
| 2.00975821 | −0.0769412 | −0.34806 | −0.27112 | −0.19418 | −0.11724 | −0.04029 | −0.50194 |
| 1.88493772 | −0.058775337 | −0.25022 | −0.19145 | −0.13267 | −0.0739 | −0.01512 | −0.36778 |
| 1.75890371 | −0.036739919 | −0.15026 | −0.11352 | −0.07678 | −0.04004 | −0.0033 | −0.22374 |
| 1.63283612 | −0.01237578 | −0.04962 | −0.03725 | −0.02487 | −0.0125 | −0.00012 | −0.07438 |
| 1.50875654 | 0.012376509 | 0.049623 | 0.037247 | 0.02487 | 0.012494 | 0.000117 | 0.074377 |
| 1.38268894 | 0.036740602 | 0.150259 | 0.113519 | 0.076778 | 0.040038 | 0.003297 | 0.223741 |
| 1.25665493 | 0.058775931 | 0.250224 | 0.191448 | 0.132672 | 0.073896 | 0.01512 | 0.367776 |
| 1.13183444 | 0.076941669 | 0.348058 | 0.271117 | 0.194175 | 0.117233 | 0.040292 | 0.501942 |
| 1.00628858 | 0.090399327 | 0.444601 | 0.354201 | 0.263802 | 0.173403 | 0.083003 | 0.625399 |
| 0.88019609 | 0.098208117 | 0.538792 | 0.440584 | 0.342376 | 0.244168 | 0.145959 | 0.735208 |
| 0.75539616 | 0.099820008 | 0.62818 | 0.52836 | 0.42854 | 0.32872 | 0.2289 | 0.82782 |
| 0.62834744 | 0.095107325 | 0.713893 | 0.618785 | 0.523678 | 0.428571 | 0.333463 | 0.904107 |
| 0.50329105 | 0.084500709 | 0.791499 | 0.706999 | 0.622498 | 0.537997 | 0.453496 | 0.960501 |
| 0.37909483 | 0.068760545 | 0.860239 | 0.791479 | 0.722718 | 0.653958 | 0.585197 | 0.997761 |
| 0.25366174 | 0.048583637 | 0.919416 | 0.870833 | 0.822249 | 0.773665 | 0.725082 | 1.016584 |
| 0.12657559 | 0.025045238 | 0.966955 | 0.94191 | 0.916864 | 0.891819 | 0.866774 | 1.017045 |
| 0 | −0.367321E−07 | 1 | 1.000001 | 1.000001 | 1.000001 | 1.000002 | 1 |

TABLE 4

| F + 2FF | F + 3FF | F + 4FF | F + 5FF |
| --- | --- | --- | --- |
| 1.04209 | 1.067136 | 1.092181 | 1.117226 |
| 1.065167 | 1.113751 | 1.162335 | 1.210918 |
| 1.066521 | 1.135282 | 1.204042 | 1.272803 |
| 1.045001 | 1.129502 | 1.214003 | 1.298504 |
| 0.999215 | 1.094322 | 1.189429 | 1.284537 |
| 0.92764 | 1.02746 | 1.12728 | 1.2271 |
| 0.833416 | 0.931624 | 1.029832 | 1.128041 |
| 0.715799 | 0.806198 | 0.896597 | 0.986997 |
| 0.578883 | 0.655825 | 0.732767 | 0.809708 |
| 0.426552 | 0.485328 | 0.544104 | 0.60288 |
| 0.260481 | 0.297222 | 0.333962 | 0.370703 |
| 0.086753 | 0.09913 | 0.111506 | 0.123883 |
| −0.08675 | −0.09913 | −0.1115 | −0.12388 |
| −0.26048 | −0.29722 | −0.33396 | −0.3707 |
| −0.42655 | −0.48533 | −0.5441 | −0.60288 |
| −0.57888 | −0.65582 | −0.73276 | −0.80971 |
| −0.7158 | −0.8062 | −0.8966 | −0.987 |
| −0.83342 | −0.93162 | −1.02983 | −1.12804 |
| −0.92764 | −1.02746 | −1.12728 | −1.2271 |
| −0.99922 | −1.09432 | −1.18943 | −1.28454 |
| −1.045 | −1.1295 | −1.214 | −1.29851 |
| −1.06652 | −1.13528 | −1.20404 | −1.27281 |
| −1.06517 | −1.11375 | −1.16234 | −1.21092 |
| −1.04209 | −1.06714 | −1.09218 | −1.11723 |
| −1 | −1 | −1 | −1 |
| −1.04209 | −1.06714 | −1.09218 | −1.11723 |
| −1.06517 | −1.11375 | −1.16234 | −1.21092 |
| −1.06652 | −1.13528 | −1.20404 | −1.27281 |
| −1.045 | −1.1295 | −1.214 | −1.29851 |
| −0.99922 | −1.09432 | −1.18943 | −1.28454 |
| −0.92764 | −1.02746 | −1.12728 | −1.2271 |
| −0.83342 | −0.93162 | −1.02983 | −1.12804 |
| −0.7158 | −0.8062 | −0.8966 | −0.987 |
| −0.57888 | −0.65582 | −0.73276 | −0.80971 |
| −0.42655 | −0.48533 | −0.5441 | −0.60288 |
| −0.26048 | −0.29722 | −0.33396 | −0.3707 |
| −0.08675 | −0.09913 | −0.1115 | −0.12388 |
| 0.086753 | 0.09913 | 0.111506 | 0.123883 |
| 0.260481 | 0.297222 | 0.333962 | 0.370703 |
| 0.426552 | 0.485328 | 0.544104 | 0.60288 |
| 0.578883 | 0.655825 | 0.732767 | 0.809708 |
| 0.715799 | 0.806198 | 0.896597 | 0.986997 |
| 0.833416 | 0.931624 | 1.029832 | 1.128041 |
| 0.92764 | 1.02746 | 1.12728 | 1.2271 |
| 0.999215 | 1.094322 | 1.189429 | 1.284537 |
| 1.045001 | 1.129502 | 1.214003 | 1.298504 |
| 1.066521 | 1.135282 | 1.204042 | 1.272803 |
| 1.065167 | 1.113751 | 1.162335 | 1.210918 |
| 1.04209 | 1.067136 | 1.092181 | 1.117226 |
| 0.999999 | 0.999999 | 0.999999 | 0.999998 |

TABLE 5

| NORMALIZED TIME STEPS | N = 1, SIN | N = 1, COS | N = 2, SIN | N = 2, COS | SIN, N = 3 | COS, N = 3 | SIN, N = 4 |
|---|---|---|---|---|---|---|---|
| 1 | 1 | −0 | 1 | 0 | 1 | 0 | 1 |
| 0.83333333 | 0.991445 | 0.130523 | 0.99766 | 0.068374 | 0.998928 | 0.04629 | 0.999982 |
| 0.666666667 | 0.965927 | 0.258816 | 0.989633 | 0.143622 | 0.995075 | 0.099123 | 0.999913 |
| 0.5 | 0.923881 | 0.382681 | 0.973658 | 0.228011 | 0.986903 | 0.161316 | 0.99975 |
| 0.3333333 | 0.866027 | 0.499998 | 0.94541 | 0.325883 | 0.97114 | 0.238509 | 0.999383 |
| 0.1666667 | 0.793355 | 0.60876 | 0.89393 | 0.448207 | 0.93828 | 0.345878 | 0.998405 |
| 0 | 0.7071 | 0.7071 | 0.7071 | 0.7071 | 0.7071 | 0.7071 | 0.7071 |

| NORMALIZED TIME STEPS | COS, N = 4 | SIN, N = 5 | COS, N = 5 | SIN, N = 6 | COS, N = 6 | SIN, N = 7 | COS, N = 7 |
|---|---|---|---|---|---|---|---|
| 1 | 0 | 1 | −0 | 1 | 0 | 1 | 0 |
| 0.83333333 | 0.034984 | 0.999605 | 0.028116 | 0.999724 | 0.023501 | 0.999796 | 0.020187 |
| 0.666666667 | 0.075635 | 0.99813 | 0.061135 | 0.998684 | 0.051296 | 0.999023 | 0.044183 |
| 0.5 | 0.124631 | 0.994836 | 0.101491 | 0.996331 | 0.08558 | 0.99726 | 0.073973 |
| 0.3333333 | 0.187505 | 0.988023 | 0.154304 | 0.991379 | 0.131029 | 0.993501 | 0.113827 |
| 0.1666667 | 0.279785 | 0.972155 | 0.234338 | 0.979515 | 0.201372 | 0.984312 | 0.176436 |
| 0 | 0.7071 | 0.7071 | 0.7071 | 0.7071 | 0.7071 | 0.7071 | 0.7071 |

| NORMALIZED TIME STEPS | SIN, N = 8 | COS, N = 8 | SIN, N = 9 | COS, N = 9 | SIN, N = 10 | COS, N = 10 | SIN, N = 11 |
|---|---|---|---|---|---|---|---|
| 1 | 1 | 0 | 1 | 0 | 1 | 0 | 1 |
| 0.83333333 | 0.999843 | 0.017692 | 0.999876 | 0.015746 | 0.999899 | 0.014186 | 0.999917 |
| 0.666666667 | 0.999247 | 0.038801 | 0.999402 | 0.034588 | 0.999513 | 0.0312 | 0.999596 |
| 0.5 | 0.997876 | 0.065135 | 0.998306 | 0.058181 | 0.998617 | 0.052568 | 0.99885 |
| 0.3333333 | 0.994927 | 0.100604 | 0.99593 | 0.090126 | 0.996664 | 0.08162 | 0.997215 |
| 0.1666667 | 0.987608 | 0.156944 | 0.989967 | 0.141302 | 0.991712 | 0.128478 | 0.99304 |
| 0 | 0.7071 | 0.7071 | 0.7071 | 0.7071 | 0.7071 | 0.7071 | 0.7071 |

| NORMALIZED TIME STEPS | COS, N = 11 | SIN, N = 12 | COS, N = 12 |
|---|---|---|---|
| 1 | −0 | 1 | 0 |
| 0.83333333 | 0.012906 | 0.99993 | 0.011839 |
| 0.666666667 | 0.028416 | 0.99966 | 0.026088 |
| 0.5 | 0.047942 | 0.999029 | 0.044063 |
| 0.3333333 | 0.074578 | 0.997641 | 0.068653 |
| 0.1666667 | 0.117778 | 0.994073 | 0.108717 |
| 0 | 0.7071 | 0.7071 | 0.7071 |

NOTE:
Taking 6 steps in (1,0) is for making a current command with 48 steps/cycle.

We claim:

1. A method of uniformly etching the surface of a substrate with a magnetic field enhanced plasma etcher, comprising:

generating a plasma within a chamber for etching a substrate contained within the chamber; and generating a rotating magnetic field over the substrate variable in amplitude or velocity over selected regions of the substrate during each cycle of rotation of the magnetic field to improve uniformity of etch of the substrate in said regions.

2. The method of claim 1 wherein the magnetic field is generated to vary in amplitude.

3. The method of claim 1 wherein the magnetic field is generated to have a uniform amplitude and to rotate at a varying velocity during a single cycle of rotation.

4. A method of improving the uniformity of the etching of a substrate in a magnetic field enhanced plasma etcher including first and second pairs of electromagnets around a periphery of a chamber housing the substrate, the method comprising:

inspecting the substrate and detecting any irregularities in an etch pattern formed on particular regions of the substrate by the etcher;

generating and applying to the first and second pairs of electromagnets respectively, first and second amplitude modulated sinusoidal currents 90 degrees out of phase; and in response to the modulated sinusoidal currents generating a magnetic field which rotates over the substrate and is variable in amplitude or velocity over the particular regions of the substrate.

5. The method of claim 4 wherein the modulated sinusoidal currents are generated to step in amplitude and follow a sinusoidal waveform modulated by a magnitude controlled version of a harmonic of the sinusoidal waveform.

6. The method of claim 4 wherein the modulated sinusoidal currents are generated to step in amplitude and to follow a square wave like waveform.

7. The method of claim 4 further comprising generating different operator selected series of first and second amplitude stepped command signals, and generating the first and second amplitude modulated sinusoidal currents in response to the first and second command signals.

8. A magnetic field enhanced plasma etcher comprising: a vacuum chamber;

means for mounting a substrate within the chamber;

means for supplying a reactant gas to the chamber;

means for generating a plasma within the chamber for etching the substrate;

electric current controlled magnetic field generating means for generating a magnetic field substantially parallel to a surface of the substrate including at least a first and a second pair of electromagnets disposed around a periphery of the chamber for forming the magnetic field; and current generator means for generating and applying to the first and second pair of electromagnets respectively, first and second sinusoidal currents 90 degrees out of phase and modulated such that the magnetic field produced by the electromagnets rotates over the substrate and is variable in amplitude or velocity over selected regions of the substrate.

9. The reactor of claim 1 wherein the current generating means comprises means for generating the first and second sinusoidal currents amplitude stepped to follow a sinusoidal waveform modulated by a magnitude controlled version of a harmonic of the sinusoidal waveform.

10. The reactor of claim 9 wherein the harmonic is the second harmonic of the sinusoidal waveform.

11. The reactor of claim 8 wherein the current generating means comprises means for generating the first and second sinusoidal currents amplitude stepped to follow a square wave like waveform.

12. The reactor of claim 8:

further including operator controllable means for generating different operator selected series of first and second amplitude stepped command signals; and wherein the current generator means is responsive to the first and second command signals.

13. The reactor of claim 12 wherein:

the operator controllable means comprises a computer having listing of different series of amplitude-stepped command signals stored therein for operator selection, and the current generating means comprises an electromagnet coil current driver for generating amplitude-stepped electromagnet coil currents in response to the command signals output from the computer.

14. The reactor of claim 12 wherein the operator controllable means comprises means for generating amplitude-stepped first and second command signals following a sinusoidal waveform modulated in amplitude by a magnitude controlled version of a harmonic of the sinusoidal waveform.

15. The reactor of claim 14 wherein the current generating means comprises means for generating modulated amplitude-stepped sinusoidal signals following a sinusoidal waveform modulated in amplitude by a magnitude controlled version of a harmonic of the sinusoidal waveform.

16. The reactor of claim 14 or 15 wherein the harmonic is a second harmonic of the sinusoidal waveform.

17. The reactor of claim 12 wherein the operator controllable means comprises means for generating amplitude stepped first and second commands signals following a square wave like waveform.

18. The reactor of claim 17 wherein the operator controllable means comprises means for generating command signals following the expressions Sin $[\pi/4(1+t^{1/n})]$ and Cos $[\pi/4(1+t^{1/n})]$.

19. A magnetic field enhanced plasma etcher comprising:

a vacuum chamber having a substrate support therein and adapted to contain a reactant gas for generating, within the chamber, a plasma;

a first and a second pair of electromagnets disposed around a periphery of the chamber for forming a magnetic field that is substantially parallel to a surface of the substrate support; and a current generator developing and applying to the first and second pair of electromagnets respectively, first and second currents 90 degrees out of phase and modulated to rotate the magnetic field produced by the electromagnets over the substrate support and to vary amplitude or velocity of the magnetic field over selected regions of the substrate support.

20. The reactor of claim 19 wherein the first and second sinusoidal currents are amplitude stepped to follow a sinusoidal waveform modulated by a magnitude controlled version of a harmonic of the sinusoidal waveform.

21. The reactor of claim 20 wherein the harmonic is the second harmonic of the sinusoidal waveform.

22. The reactor of claim 1 wherein the first and second sinusoidal currents are amplitude stepped to follow a square wave like waveform.

23. The reactor of claim 1 further comprising:

a controller for generating different selected series of first and second amplitude stepped command signals; and wherein the current generator is responsive to the first and second command signals.

24. The reactor of claim 23 wherein the controller further comprises a computer having a listing of different series of amplitude stepped command signals stored therein for selection, and the current generator further comprises an electromagnet coil current driver for generating amplitude stepped electromagnet coil currents in response to the command signals output from the computer.

25. The reactor of claim 23 wherein the controller generates amplitude stepped first and second command signals that follow a sinusoidal waveform modulated by a magnitude controlled version of a harmonic of the sinusoidal waveform.

26. The reactor of claim 25 wherein the harmonic is a second harmonic of the sinusoidal waveform.

27. The reactor of claim 23 wherein the controller generates amplitude stepped first and second command signals that follow a square wave like waveform.

28. The reactor of claim 27 wherein the controller generates command signals following the expressions $$\sin\left[\frac{\pi}{4}(1+t^{\frac{1}{n}})\right] \text{ and } \cos\left[\frac{\pi}{4}(1+t^{\frac{1}{n}})\right].$$

* * * * *